(12) United States Patent
Sharma et al.

(10) Patent No.: US 6,850,433 B2
(45) Date of Patent: Feb. 1, 2005

(54) MAGNETIC MEMORY DEVICE AND METHOD

(75) Inventors: Manish Sharma, Sunnyvale, CA (US); Lung The Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 58 days.

(21) Appl. No.: 10/196,877

(22) Filed: Jul. 15, 2002

(65) Prior Publication Data

US 2004/0008537 A1 Jan. 15, 2004

(51) Int. Cl.[7] .............................................. G11C 11/15
(52) U.S. Cl. ...................................... 365/173; 365/171
(58) Field of Search ................................ 365/173, 171, 365/158, 175; 257/295

(56) References Cited

U.S. PATENT DOCUMENTS

| | | | | |
|---|---|---|---|---|
| 5,936,293 | A | * 8/1999 | Parkin | 257/422 |
| 6,166,948 | A | 12/2000 | Parkin et al. | |
| 6,538,917 | B1 | * 3/2003 | Tran et al. | 365/158 |
| 6,576,969 | B2 | * 6/2003 | Tran et al. | 257/421 |
| 6,593,608 | B1 | * 7/2003 | Sharma et al. | 257/295 |
| 2001/0007532 | A1 | 7/2001 | Kobayashi et al. | |
| 2003/0057461 | A1 | * 3/2003 | Tran et al. | 257/295 |

OTHER PUBLICATIONS

Dimopoulos T et al: "Compensation of Magnetostatic Interactions in Magnetic Tunnel Junctins with Artificial Antiferromagnets" journal of magnetism and magnetic materials, elsevier, amsterdam, NL, vol. 242–245, Apr. 2002, pp. 512–514, XP004358740 ISSN: 0304–8853.

Tiusan C et al: "Tunnel magnetoresistance 1,2,9,10 versus micromagnetism in magnetic tunnel jucntions" 44th Annual Conference on Magnetism and Magnetic Materials, San Jose, CA USA, Nov. 15–18, 1999 vol. 87, No. 9, PT. 1–3, pp. 4676–4678 XP002255641 Journal of Applied Physics, May 1, 2000, AIP, USA ISSN: 0021–8979.

* cited by examiner

Primary Examiner—Anh Phung

(57) ABSTRACT

A magnetic memory device can include a synthetic ferrimagnetic data, a soft reference layer and a tunneling layer. The synthetic ferrimagnetic data layer has a magnetic moment directable to a first orientation and a second orientation. The soft reference layer has a lower coercivity than the synthetic ferrimagnetic data layer. The tunneling layer has electrical resistance qualities which are influenced by magnetic moment orientations of the synthetic ferrimagnetic data layer and the soft reference layer.

24 Claims, 12 Drawing Sheets

400

410

Establishing a magnetic orientation in a synthetic ferrimagnetic data layer.

420

Applying a relatively small magnetic field to a soft reference layer.

430

Measuring the resistance to a voltage applied to a magnetic tunnel junction.

Fig. 4

MAGNETIC MEMORY DEVICE AND METHOD

FIELD OF THE INVENTION

The present invention relates to memory devices. More particularly, the present invention relates to a magnetic storage device.

BACKGROUND OF THE INVENTION

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data, ideas and trends in most areas of business, science, education and entertainment. Frequently, these advantageous results are realized through the use of information stored on memory media and manipulated by a processing device. The configuration and type of memory utilized to store the information can have significant impacts on information processing performance.

Numerous electronic devices include processors that operate by executing programs comprising a series of instructions for manipulating data in the performance of useful tasks. The programs and associated data are typically stored in a memory location with a unique indicator or address. The utility a processing device provides often depends upon the amount of information a memory stores and the speed at which it is accessible. The ability to access a memory and transfer information quickly and conveniently usually has a significant impact on information processing latency.

Magnetic memories are a type of memory that usually offer many advantages. For example, magnetic memories perform read and write operations much faster and consume less power than other types of short term and long term memory, such as dynamic random access memories (DRAM), synchronous random access memory (SRAM), flash memory and traditional hard drives. Magnetic memories can also typically perform read and write operations much faster (by orders of magnitude) than conventional long-term storage devices such as hard drives. In addition, magnetic memories are typically more compact and facilitate the storage of more information in a smaller space than other types of traditional memories.

A typical MRAM device includes an array of memory cells with word lines extending along rows of the memory cells and bit lines extending along columns of the memory cells. Each memory cell is located at a cross point of a word line and a bit line. The memory cells are usually based on tunneling magneto-resistive (TMR) devices such as spin dependent tunneling (SDT) junctions. A traditional SDT junction includes a pinned layer, a sense layer and an insulating tunnel barrier sandwiched between the pinned and sense layers. The pinned layer has a magnetization orientation that is fixed so as not to rotate in the presence of an applied magnetic field strength within a defined range. The sense layer has a magnetization that can be oriented in either of two directions, the same direction as the pinned layer magnetization or the opposite direction of the pinned layer magnetization.

The magnetization orientation of the pinned layer is fixed, typically by an underlying antiferromagnetic (AF) pinning layer. The pinned layer in some traditional magneto-resistive memory devices may have a net magnetic moment, which leads to undesirable effects. One such effect is that of a demagnetizing field. For example, a magnetic field from the pinned layer reaches and interacts with the sense layer in a manner that leads to loss of data if this magnetic field becomes too strong. In addition, the presence of the magnetic field from the pinned layer usually leads to the requirement that an asymmetric magnetic field be used to switch the state of the data layer, which typically adds to the complexity of the writing process. Further complications also often arise since the tolerance for stray magnetic fields during writing is lowered.

SUMMARY OF THE INVENTION

The present invention is a magnetic memory device and method. In one embodiment a present invention magnetic memory device includes a synthetic ferrimagnetic data layer, a soft reference layer and a tunneling layer. The synthetic ferrimagnetic data layer has a magnetic moment directable to a first orientation and a second orientation. The soft reference layer has a lower coercivity than the synthetic ferrimagnetic data layer. The tunneling layer has electrical resistance qualities which are influenced by magnetic moment orientations of the synthetic ferrimagnetic data layer and the soft reference layer.

BRIEF DESCRIPTION OF THE DRAWINGS

FIG. 4 shows a flow chart of a magnetic memory method in accordance with one embodiment of the present invention.

DETAILED DESCRIPTION OF THE INVENTION

Reference will now be made in detail to the preferred embodiments of the invention, a magnetic memory system and method, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it is understood the present invention may be practiced without these specific details. In other instances, well known methods, procedures, components, and circuits have not been described in detail as not to unnecessarily obscure aspects of the current invention.

The present invention facilitates convenient and efficient storage of information in a magnetic memory system and method. In one embodiment, a present invention magnetic memory device includes a hard synthetic ferrimagnetic data (a.k.a, sense) layer and a soft synthetic ferrimagnetic reference layer. The terms hard and soft are relative and it is understood that for ease of use and to avoid obfuscating the invention, the terms "relatively hard" or "relatively soft" are simply referred to "hard" or "soft" for purposes of this description. Utilizing synthetic ferrimagnetic layers facilitates utilization of the same magnetic materials in constructing the magnetic sub-layers of a data and/or reference layer. This minimizes the number of textures and growth mechanism idiosyncrasies that impact obtaining correct crystal orientation.

Figure 1:
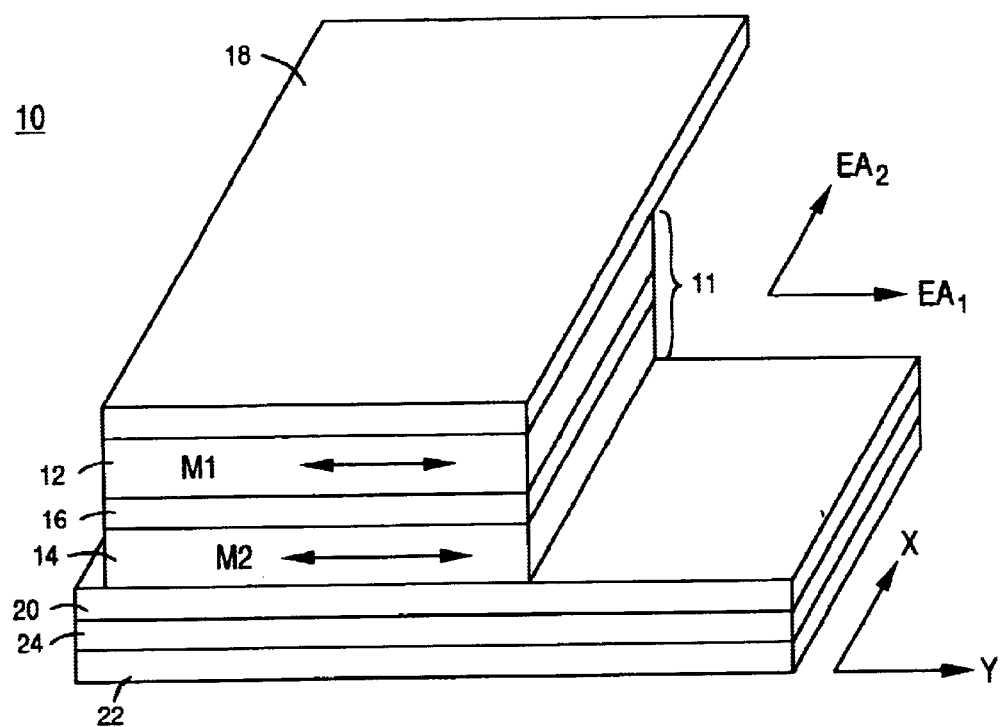
FIG. 1 shows a block diagram of a magnetic memory device in accordance with one embodiment of the present invention.

FIG. 1 shows a block diagram of a magnetic memory device 10 in accordance with one embodiment of the present invention. In one exemplary implementation, magnetic memory device 10 is a memory cell. Magnetic memory device 10 includes a magnetic tunnel junction 11 having a synthetic ferrimagnetic data layer 12, a soft reference layer 14, and a tunnel barrier 16 between synthetic ferrimagnetic data layer 12 and soft reference layer 14. The synthetic ferrimagnetic data layer 12 is coupled to tunnel barrier 16 which is coupled to soft reference layer 14. Synthetic ferrimagnetic data layer 12 is also referred to as a sense layer and has a magnetic moment directable to a first and a second orientation. The magnetization of synthetic ferrimagnetic data layer 12 (represented by the vector M1) and magnetization of soft reference layer 14 (represented by M2) is dynamically controlled to be substantially orientated in either of two directions (e.g., along an easy axis such as EA1 of the data layer 12). For example, the tunnel barrier 16 allows quantum mechanical tunneling to occur between the synthetic ferrimagnetic data layer 12 and soft reference layer 14 in which the resulting resistance to perpendicularly applied current is influenced by the relative magnetic moment orientations of synthetic ferrimagnetic data layer 12 and soft reference layer 14.

The synthetic ferrimagnetic data layer 12 and soft reference layer 14 may comprise a variety of materials. For example, soft reference layer 14 may be made of a ferromagnetic material or synthetic ferrimagnetic material (SF), also known as an artificial antiferromagnet. The synthetic ferrimagnetic data layer 12 and soft reference layer 14 also have different coercivities. For example, reference layer 14 is "soft" (e.g., has a lower coercivity) relative to a "hard" data layer 12 (e.g., with a higher coercivity). The coercivity impacts the ease at which the magnetic moment orientations of the layers are changed. For example, it is relatively easy to change the magnetic moment orientation of a soft layer (e.g., with a "weak" magnetic field produced by a small current flowing in a conductor).

The tunneling phenomenon of tunnel barrier 16 is electron spin dependent, causing the resistance of the magnetic tunnel junction 11 to be a function of the relative orientations of the magnetization vectors (M1 and M2) of the data and reference layers 12 and 14. For example, resistance of the magnetic tunnel junction 11 to a perpendicularly applied current (e.g., flowing from synthetic ferrimagnetic data layer 12 through tunnel barrier 16 to soft reference layer 14 or vise versa) is a first value (e.g., R) if the relative orientations of the magnetization vectors (e.g., M1 and M2) are the same and a second value (e.g., R+ΔR) if the magnetization orientations are opposite. The tunnel barrier 16 can be made from a variety of dielectrics and semiconductor materials including aluminum oxide ($Al_2O_3$) silicon dioxide ($SiO_2$), tantalum oxide ($Ta_2O_5$) silicon nitride ($Si_3N_4$), aluminum nitride ($AlN_x$) and/or magnesium oxide (MgO). Thickness of the tunnel barrier 16 may vary in range (e.g., from about 0.5 nanometers to about three nanometers). The present invention is not necessarily limited to a particular tunnel barrier range.

The two different resistance states of magnetic tunnel junction 11 are utilized to indicate storage of a logical bit value. For example, when the orientations of magnetization vectors of synthetic ferrimagnetic data layer 12 and soft reference layer 14 are the same, resistance to a perpendicularly applied current is within a first resistance value range corresponding to a first predetermined logical value (e.g., "0") and when the orientations are opposite the resistance to a perpendicularly applied current is within a second resistance value range corresponding to a second predetermined logical value (e.g., "1"). If the magnetization vector M1 of synthetic ferrimagnetic data layer 12 and the magnetization vector M2 of soft reference layer 14 are pointing in substantially the same direction, the orientation of the magnetic tunnel junction 11 may be referred to as being "parallel." If the magnetization vectors M1 and M2 are pointing in substantially opposite directions, the orientation of the magnetic tunnel junction 11 may be referred to as being "anti-parallel." The resistive values corresponding to the two magnetic orientations (parallel and anti-parallel) can be associated with a logic value (e.g., "0" and "1"). The logic value that is represented by a particular orientation configuration is arbitrarily predetermined in one implementation.

The present invention is not limited to the magnetization orientation of the two layers relative to each other being either parallel or anti-parallel. More generally, the magnetic orientation of each layer may be selected such that the measured resistance ranges between the layers is different for two discernable states. In one exemplary implementation, a first state includes a first stable orientation and a second state includes a second stable orientation. For example, a synthetic ferrimagnetic sense layer may be operable for magnetization in either of two discernable states. The two discernable states are associated with two stable orientations and may comprise a first range of angles and a second range of angles between the magnetic orientation vector M1 of synthetic ferrimagnetic data layer 12 and magnetic orientation vector M2 of soft reference layer 14, wherein the electrical resistance across the tunnel layer has a first resistance range and a second resistance range corresponding to the two stable magnetic moment orientations. The resistance to the electrical current changes depending upon the relative direction of a first or second magnetic orientation of synthetic ferrimagnetic data layer 12 with respect to the magnetic orientation of soft reference layer 14.

The magnetic orientations of data and reference layers within magnetic memory device 10 are controlled by electro-magnetic fields associated with a group of electrical conductor elements. Referring still to FIG. 1, a first conductor 18 extending along the x-axis is coupled to the synthetic ferrimagnetic data layer 12. A second conductor 20 extending along the y-axis is coupled to the soft reference layer 14. The first and second conductors 18 and 20 are shown as being substantially orthogonal (although the present invention is not limited to an orthogonal orientation). Below the second conductor 20 is a third conductor 22 (e.g., a read conductor), which also extends along the y-axis. An electrical insulator 24 (e.g., a layer of dielectric material) separates the second and third conductors 20 and 22. The conductors (e.g., 18, 20 and 22) can comprise a variety of electrically conductive materials including aluminum, copper, gold or silver. By applying a current in particular directions on a conductor (e.g., conductors 18, 20 and/or 22), the data and/or reference layers are exposed to electromagnetic fields generated by the current in the conductor. Magnetic fields of sufficient strength are applied and the magnetic orientations of data and reference layers conform to established electromagnetic principles (e.g., the right hand rule) and are known.

Figure 2A:
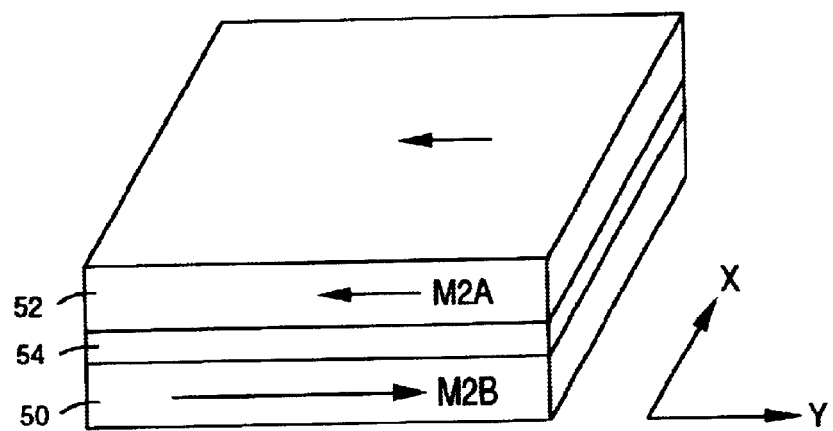
FIG. 2A shows one example of synthetic ferrimagnetic sub-layers with magnetic moments oriented in opposite directions.
Figure 2B:
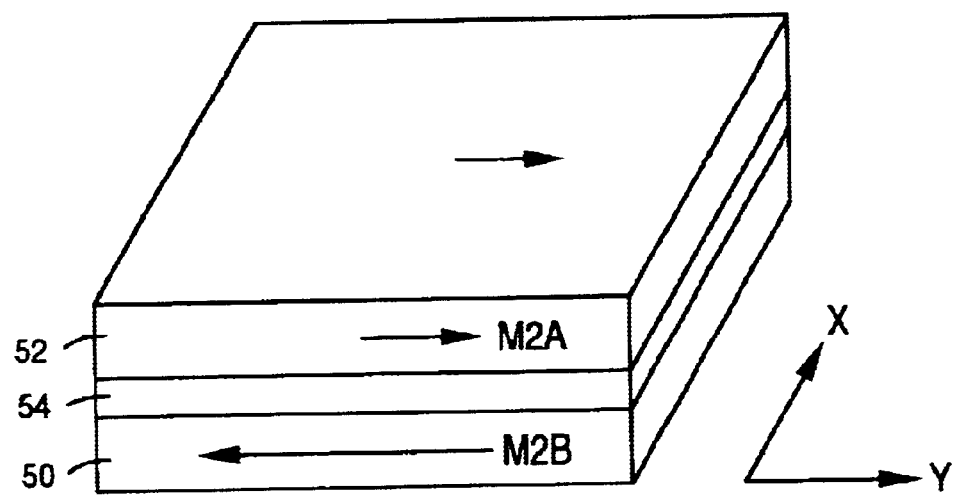
FIG. 2B shows one example of synthetic ferrimagnetic sub-layers maintaining relative opposite magnetic moment orientations when the orientations are flipped.

FIGS. 2A and 2B show one example of a synthetic ferrimagnetic layer 59 that includes first and second ferromagnetic sub-layers 50 and 52 separated by a spacer sub-layer 54 (e.g., the spacer layer 54 may be metallic). In one example, the first sub-layer has a magnetic moment orientation that is rotatable to either a first or second orientation and the spacer sub-layer magnetically couples the first and second sub-layers so that the second sub-layer has a magnetic orientation that is maintained substantially opposite of the first sub-layer. The ferromagnetic sub-layers 50 and 52 may be made of a variety of materials including cobalt iron (CoFe), nickel iron (NiFe), Cobalt (Co), etc., and the spacer sub-layer 54 may be made of electrically conductive, non-magnetic materials including Ruthenium (Ru), Rhenium (Re), Rhodium (Rh), Copper (Cu), Tellurium (Te), Chromium (Cr), etc. In one exemplary implementation the thickness of the spacer sub-layer ranges between about 0.2 nm and 2 nm and each ferromagnetic sub layer 50 and 52 has a coercivity of ranging between about 10–100 Oe with similar shaped hystereris loops.

The exchange coupling between the magnetization vectors or magnetic moment orientations of the two ferromagnetic sub-layers is very strong. Consequently, a very large magnetic field (e.g., 4000 Oe) would be required to "decouple" the magnetization vectors and overcome the maintenance of substantially opposite magnetic moments in the ferromagnetic sub-layers 50 and 52. For example, a field of 4000 Oersted (e.g., $3.2 \times 10^5$ Amperes/Meter) may be needed to completely rotate the magnetic moment orientations of both the ferromagnetic layers 50 and 52 in the same direction. By selecting suitable thickness and material for the spacer layer 54, the exchange coupling may be made suitably strong such that at normal operating conditions, very little decoupling or rotation occurs and the magnetic moment vectors of ferromagnetic layers 50 and 52 point substantially 180 degrees apart.

The overall or net moment of the synthetic ferrimagnetic layer is determined by the difference in the moments of the ferromagnetic sub-layers. For example, overall moment of synthetic ferrimagnetic layer 59 ($M_{SF}$) is equal to the moment of first ferromagnetic sub-layer 50 ($M_{FM1}$) minus the moment of second ferromagnetic sub-layer 52 ($M_{FM2}$). This relationship can be expressed by the equation $M_{SF} = M_{FM1} - M_{FM2}$. The unbalanced ("unequal") moments M1 and M2 of the present invention result in an overall non-zero moment. A low coercivity allows the overall magnetization vector (e.g., M2) of the SF layer (e.g., reference layer 14) to be switched easily between the orientations shown in FIGS. 2A and 2B.

The material and dimensions (e.g., thickness) of the spacer sub-layer 54 is selected to cause the first and second sub-layers 50 and 52 to be magnetically coupled such that their magnetic orientations are substantially opposite or anti-parallel. For example, FIG. 2A shows the magnetization vector M2A of the upper sub-layer 52 oriented along the negative y-axis and the magnetization vector M2B of the lower sub-layer 50 oriented along the positive y-axis. The thickness of the spacer layer 54 may depend on the material included in spacer layer 54. For example, the thickness of spacer sub-layer 54 may be between about 0.2 nm and 2 nm.

In one embodiment of the present invention, a synthetic ferrimagnetic layer has a primary sub-layer that influences the resistance measured across the data layer, the magnetic tunnel barrier and the primary sub-layer (e.g., sub-layer 50). The measured resistance is utilized to determine the magnetic moment orientation or direction of the data layer. The primary sub-layer is closest to a tunnel barrier (e.g., tunnel barrier 16) in one embodiment. In one exemplary implementation, a reference orientation conductor (e.g., third conductor 22) is farther from a one ferromagnetic sub-layer layer (e.g., 50 or 52) than another sub-layer of a synthetic ferrimagnetic layer. Thus, the magnetic orientation of each sub layer may be known by its preference to favor one direction in each ferromagnetic sub-layer, the direction depending, in part, on the direction of the current through the read conductor (e.g., third conductor 22).

The coercivity of a synthetic ferrimagnetic (SF) layer is low in one embodiment of the present invention. For example, the coercivity of a synthetic ferrimagnetic (SF) layer (e.g., a synthetic magnetic reference layer) is lower than another layer (e.g., a synthetic magnetic data layer) and the lower coercivity synthetic ferrimagnetic layer is soft relative to the higher coercivity layer. For example, an ultra-low coercivity in a SF layer allows the magnetization vectors (M2A and M2B) of the SF layer (e.g., reference layer 14) to be switched easily between orientations (e.g., as shown in FIGS. 2A and 2B). In practice, the orientations of the magnetic moment vectors M2A and M2B for the ferromagnetic layers 50 and 52 may be in any substantially opposite directions just before the magnetic field is applied. Once the magnetic field is applied, their orientations conform to established electromagnetic principles (e.g., the right hand rule) and are known. Since the coercivity of the synthetic ferrimagnetic layer is low, a relatively small magnetic field applied to the ferromagnetic layers 50 and 52 pushes the magnetization vectors M2A and M2B to known positions (e.g., orthogonal to the applied magnetic field). A reference layer may include a synthetic ferrimagnetic layer that is constructed to have a net magnetic moment (e.g., net magnetization vector) that is substantially zero. For example, the reference layer may include multiple magnetization vectors (e.g., magnetization vectors M2A and M2B) that are substantially equal and opposite and hence may essentially "cancel" each other at a distance.

In one embodiment of the present invention, the coercivity of a synthetic ferrimagnetic (SF) layer is relatively high. For example, the coercivity of a synthetic ferrimagnetic (SF) layer (e.g., a synthetic magnetic data layer) is higher than another layer (e.g., a synthetic magnetic reference layer) and the higher coercivity synthetic ferrimagnetic layer is hard relative to the lower coercivity layer. A high coercivity of a SF layer enables the magnetization or magnetic moment vectors (M2A and M2B) of the SF layer (e.g., data layer 12) to hold an orientation (e.g., as shown in FIGS. 2A and 2B) without switching when exposed to low magnetic fields. In practice, the orientations of the magnetic vectors M2A and M2B for the ferromagnetic layers 50 and 52 are set when exposed to a sufficiently strong magnetic field. Once the magnetic field is applied, their orientations conform to established electromagnetic principles and are known. Since the coercivity of the synthetic ferrimagnetic layer is high, a relatively small magnetic field applied to the ferromagnetic layers 50 and 52 does not change the magnetization vectors (e.g., M2A and M2B) from the established positions.

Figure 3:
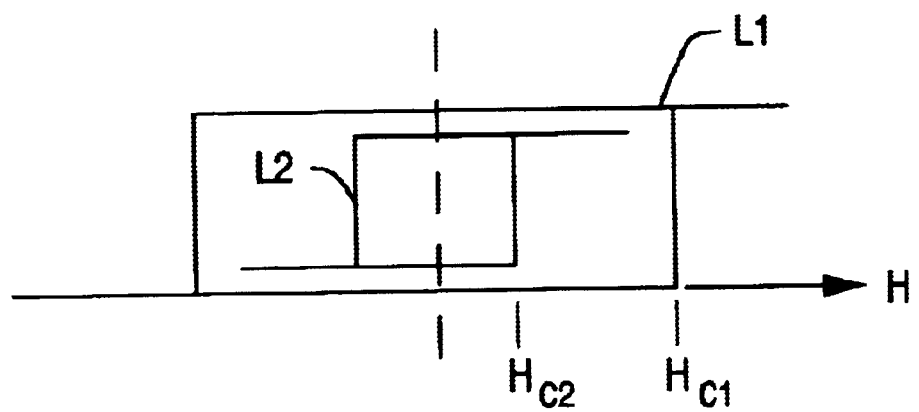
FIG. 3 is a diagram illustrating an exemplary coercivity relationship between a hard data layer and a soft reference layer.

FIG. 3 is diagram illustrating exemplary coercivity relationships between a hard layer (e.g., data layer 12) and a soft reference layer (e.g., reference layer 14). The coercivity of the hard data layer (Hc1) is much higher (e.g., at least 2 to 5 times greater) than coercivity of the soft reference layer (Hc2). For example, the coercivity of the hard data layer (Hc1) can be about 25 Oe and the coercivity of the soft reference layer (Hc2) can be about 5 Oe. Thus, the reference layer is considered softer than the data layer and the magnetization of vector of the reference layer (e.g., M2) is much easier to flip.

In some embodiments of the present invention, a synthetic ferrimagnetic layer comprises more than two ferromagnetic layers. In these embodiments, adjacent sub-layers (e.g., ferromagnetic sub-layers) may be coupled by spacer sub-layers (e.g., similar to spacer layer 54) and may have their magnetic orientations in substantially opposite directions for adjacent sub-layers. In one embodiment, the net magnetic moment of the synthetic ferrimagnetic is substantially zero when utilized as a reference layer. Embodiments provide for both even and odd numbers of ferromagnetic layers in a synthetic ferrimagnetic reference layer.

Referring now to FIG. 4, a flow chart of magnetic memory method 400 is shown, one embodiment of the present invention. Magnetic memory method 400 provides a method of operating a magnetic storage device. Magnetic memory method 400 facilitates utilization of a hard synthetic ferrimagnetic data layer and a soft reference layer. In one exemplary implementation currents are passed in the vicinity of a data layer and reference layer which create magnetic fields that influence the respective magnetic moment orientations of the data layer and the reference layer.

In step 410, a particular magnetic orientation is established in a synthetic ferrimagnetic data layer. The particular magnetic orientation corresponds to a logical value (e.g., of a data bit) is utilized to "store" or "write" information in the synthetic ferrimagnetic data layer. This may be achieved by applying one or more currents to a first conductor (e.g., first conductor 18) and second conductor (e.g., second conductor 20) that produces a magnetic field. The data layer is exposed to the magnetic field which sets or creates a magnetic orientation in the synthetic ferrimagnetic data layer. The current is sufficiently high to generate magnetic fields that in combination exceed the coercivity of the data layer and therefore cause the magnetization vector (e.g., M1) of the data layer to be set in a desired orientation (the orientation depends upon the directions of the currents supplied to the first and second conductors). The magnetization is set to an orientation that corresponds to a logic "1" or an orientation that corresponds to a logic "0". The magnetization vector (e.g., M1) of the data layer retains its orientation after write currents are removed from the conductors (e.g., 18 and 20).

The magnetization vector (e.g., M2) of the reference layer (e.g., ferromagnetic layers 50 and 52) may be affected by the write process and may not retain that orientation. If the reference layer (e.g., reference layer 14) is an "ultra-soft," synthetic ferromagnetic layer, the magnetization vectors (e.g., M2A and M2B) may change their magnetization orientations when the write currents are removed from the first and second conductors. In one exemplary implementation, the conductor lines are a selected word line and/or bit line.

In one embodiment, additional conductors (e.g., conductor 22) may be used to assist with "write" operations. By supplying a current to an additional conductor (e.g., a third conductor) during write operations, the resulting magnetic field about the additional conductor may combine with the magnetic fields associated with the first and second conductors to help set the magnetization vector (e.g., M1) of the data layer in a desired orientation.

Referring still to FIG. 4, a relatively small magnetic field is applied to a soft reference layer (e.g., reference layer 14) in step 420. The relatively small magnetic field causes the soft reference layer to have a predetermined magnetic moment orientation without changing the magnetic orientation of the synthetic ferrimagnetic data layer. In one exemplary implementation, the relatively small magnetic field establishes a magnetic orientation (e.g., M2A) in a sub-layer (e.g., ferromagnetic sub-layer 52) of the reference layer that is substantially orthogonal to the magnetic field. For example, the reference layer may have multiple layers or sub-layers itself that have substantially the same coercivity and are magnetically coupled in opposite directions. The applied magnetic field establishes a magnetic orientation of a first ferromagnetic layer (e.g., first ferromagnetic sub-layer 52) of a reference layer in either a substantially parallel or a substantially anti-parallel magnetic orientation (e.g., M1) to the data layer (e.g., data layer 12).

In one exemplary implementation, a current is supplied to a conductor (e.g., third conductor 22) and the resulting magnetic field causes the magnetization vectors (e.g., M2A and M2B) of ferromagnetic sub-layers (e.g., 50 and 52) in a soft synthetic ferrimagnetic reference layer (e.g., reference layer 14) to assume a specific orientation. The resulting magnetic field does not affect the magnetization vector (M1) of the synthetic ferrimagnetic data layer 12. Furthermore, since the coercivity of the soft reference layer 14 is extremely low, the magnitude of the third conductor current may be low. For example, the coercivity balance of synthetic ferrimagnetic reference layer 14 may be only a few Oersteds (e.g., a few hundred Amperes/Meter).

In step 430, the resistance to a voltage perpendicularly applied to magnetic tunnel junction 11 is measured. For example, resistance between a first ferromagnetic sub-layer (e.g., ferromagnetic layer 52) of a soft reference layer and a hard data layer (e.g., data layer 12) is measured and utilized to determine the magnetic orientation (e.g., M1) of the data layer. The logical value of a bit stored in the storage device is determined based upon the resistance level. This step may be accomplished by applying a voltage across a magnetic tunnel junction (e.g., magnetic tunnel junction 11) as the current is supplied to a reference orientation conductor (e.g., third conductor 22). For example, first and second conductors 18 and 20 may be used to apply a voltage differential across the magnetic tunnel junction 11 while a current supplied to third conductor 22 establishes the magnetic moment orientations in the soft reference layer 14. The voltage differential applied by first and second conductors 18 and 20 cause a "sense" current to flow through the magnetic tunnel junction 11. The sensed current ($I_s$) is inversely proportional to the resistance of the magnetic tunnel junction 11. Thus, $I_s=V/R$ or $I_s=V/(R+\Delta R)$, where V is the applied Voltage, $I_s$ is the sensed current, R is the nominal resistance of the magnetic tunnel junction 11, and $\Delta R$ is the difference in resistance between the parallel magnetization orientation and the anti-parallel magnetization orientation.

Figure 6A:
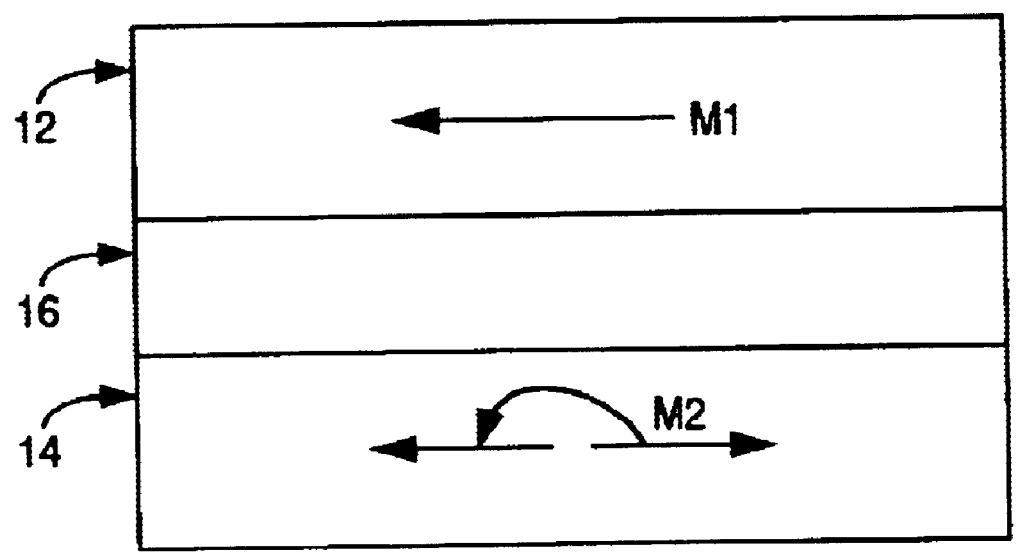
FIG. 6A shows an exemplary change in the orientation of a magnetic moment associated with a corresponding change in a pulse signal.
Figure 6B:
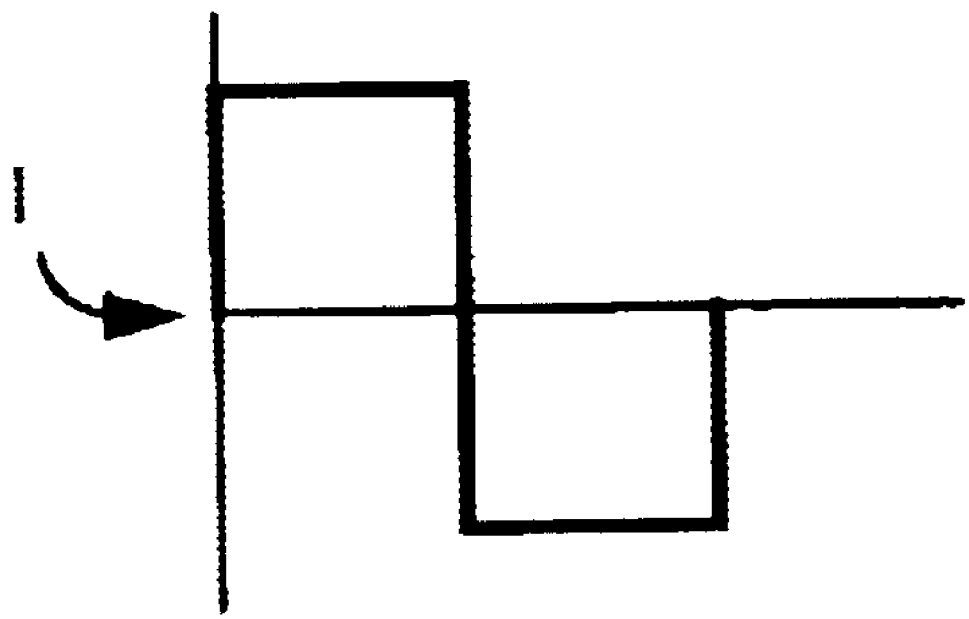
FIG. 6B is a illustration of an exemplary pulse signal in accordance with one embodiment of the present invention.
Figure 6C:
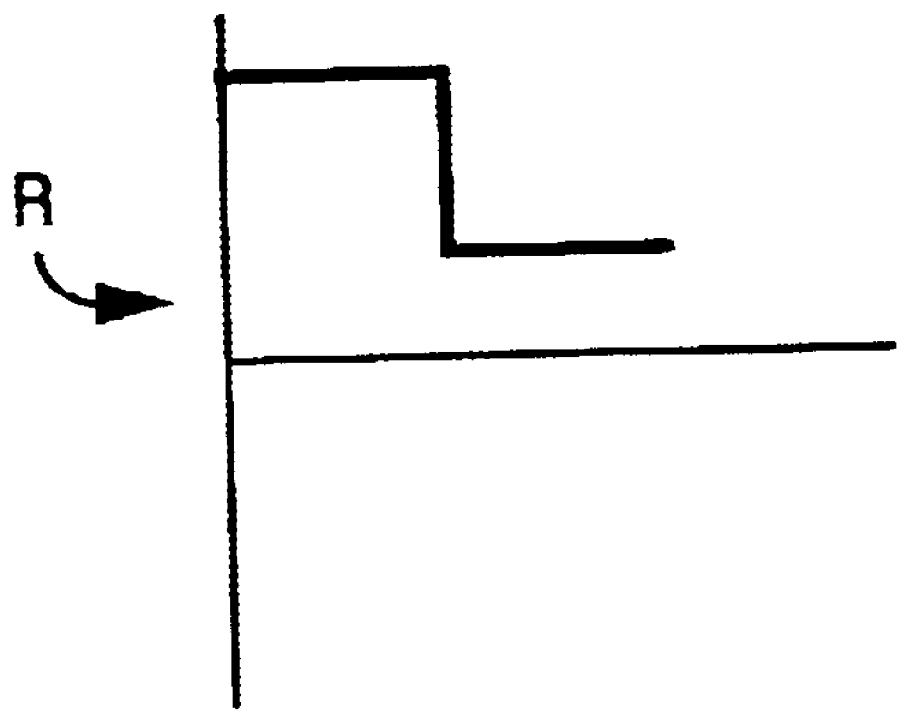
FIG. 6C shows an exemplary resulting resistance decrease in response to a change in orientation of magnetic moment in response to an impulse signal.
Figure 7A:
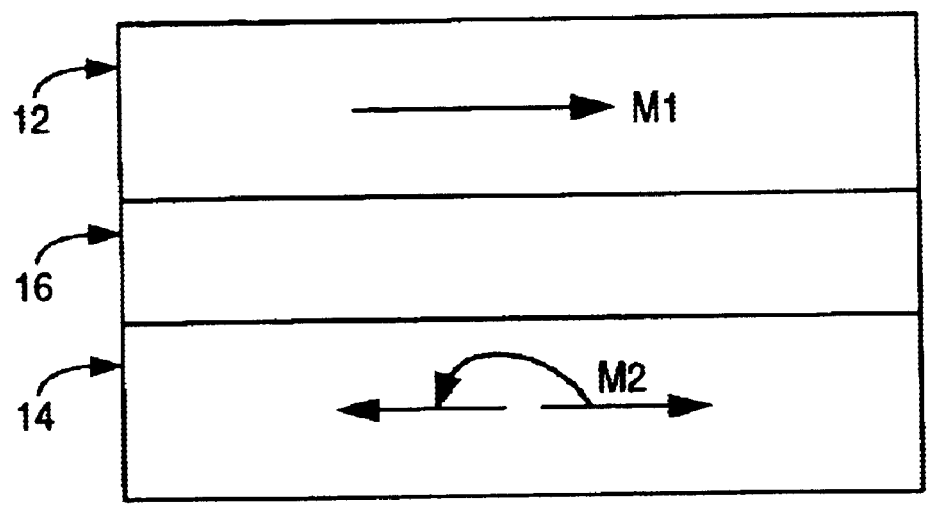
FIG. 7A is another illustration of an exemplary change in the orientation of a magnetic moment associated with a corresponding change in a pulse signal.
Figure 7B:
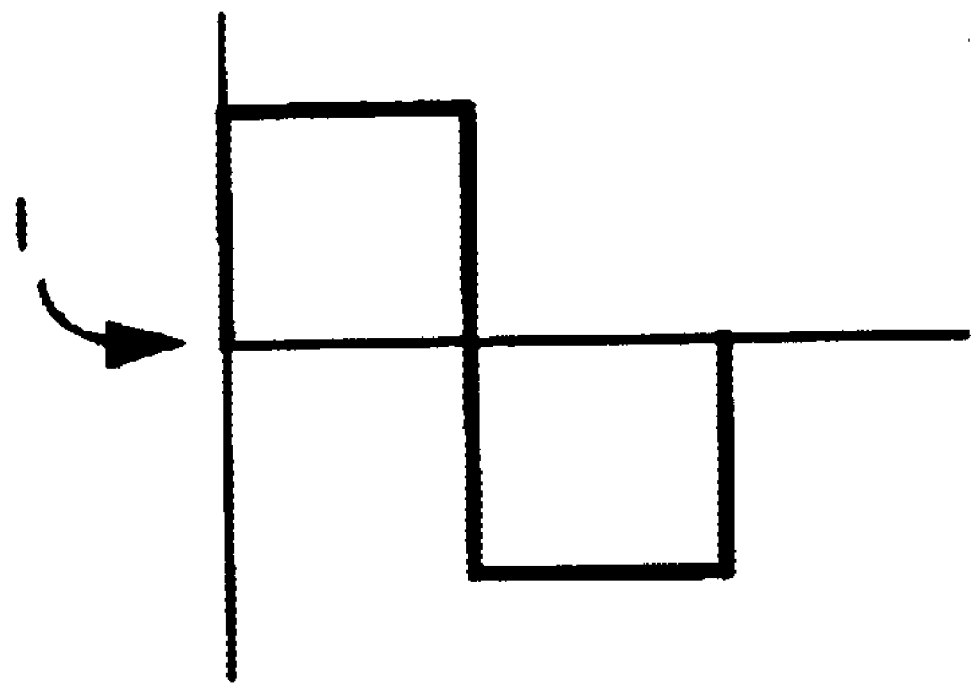
FIG. 7B is another illustration of an exemplary pulse signal in accordance with one embodiment of the present invention.
Figure 7C:
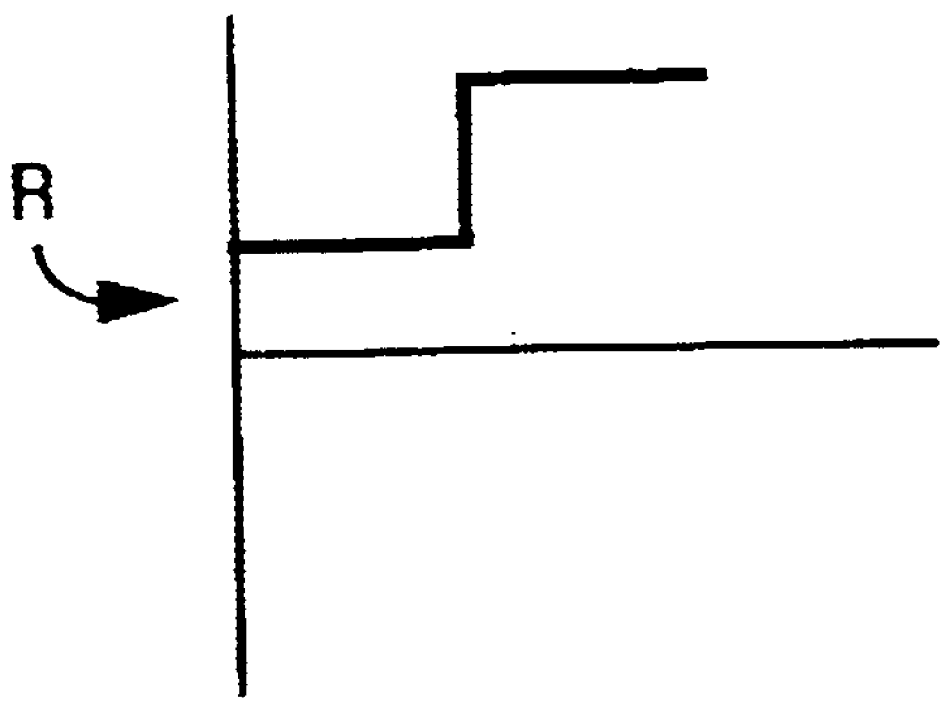
FIG. 7C shows an exemplary resulting resistance increase in response to a change in orientation of magnetic moment in response to an impulse signal.

The present invention is readily adaptable to other methods of reading a magnetic memory device. For example a bipolar pulse may be applied to the reference layer orientation conductor (e.g., third conductor 22) and transition of the junction resistance is examined. FIGS. 6A and 7A show exemplary implementations of a change in the orientation of M2 for pulse signals in corresponding FIGS. 6B and 7B. FIGS. 6C and 7C show the resulting resistance change or transition. The direction of the transition (e.g., from high to low or low to high) indicates the magnetization orientation of the data layer, and therefore, the logic value stored in the magnetic memory device. The bipolar read operation references to itself. Therefore, this dynamic sense approach is insensitive to variations across different devices.

Figure 5:
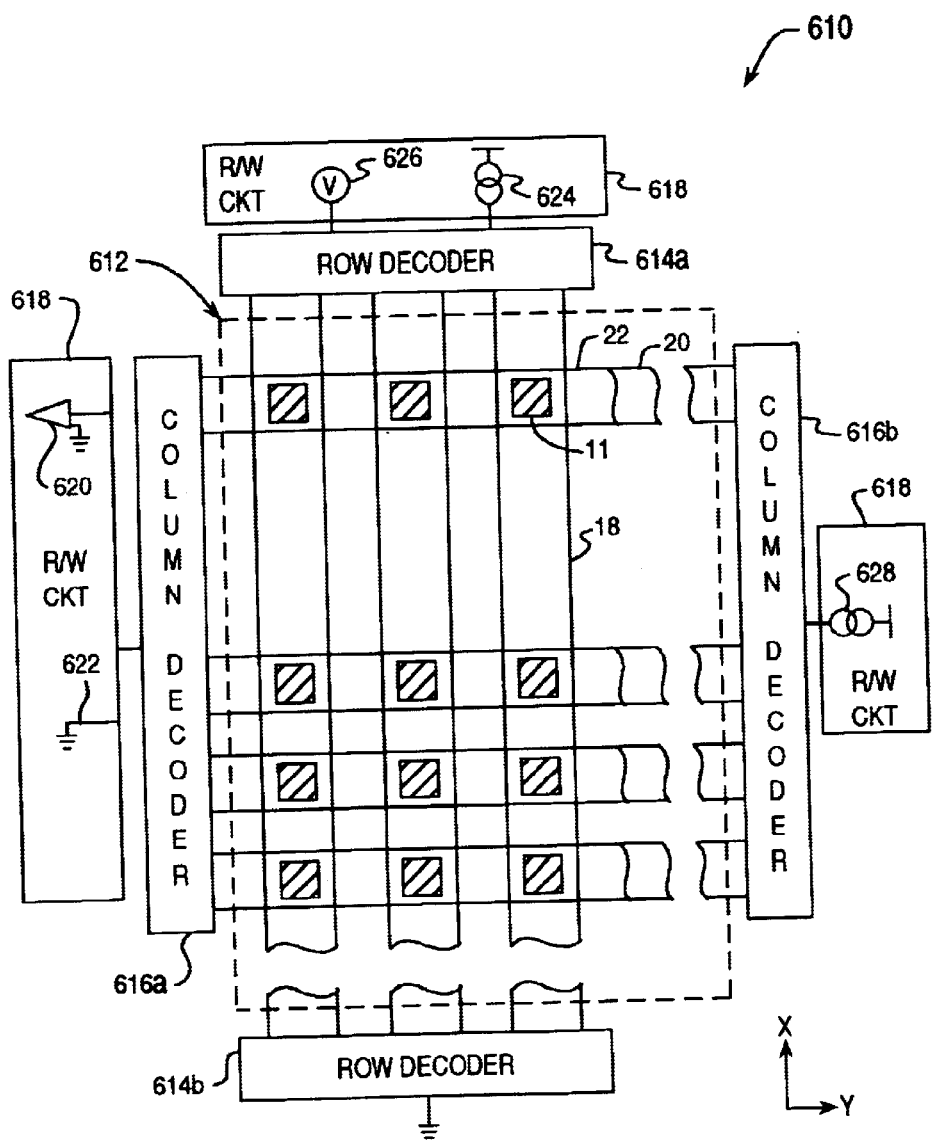
FIG. 5 illustrates a magnetic random access memory (MRAM) device, one exemplary implementation of a present invention memory device.

Reference is now made to FIG. 5, which illustrates a magnetic random access memory (MRAM) device 610, one exemplary implementation of a present invention memory device. MRAM device 610 includes an array 612 of magnetic tunnel junctions (e.g., magnetic tunnel junction 11). The magnetic tunnel junctions are arranged in rows and columns, with the rows extending along a y-direction and the columns extending along an x-direction. Only a relatively small number of the magnetic tunnel junctions are shown to simplify the illustration of the MRAM device 610. In practice, arrays of any size may be used. A magnetic memory tunnel junction is located at a cross point of two electrical conductors (e.g., a word line and a bit line). Electrically conductive elements functioning as word lines (e.g., first conductor 18) extend along the x-direction in a plane on one side (e.g., top side) of the array 612. The word lines are in contact with the data layers (e.g., data layer 12) of the magnetic tunnel junctions (e.g., magnetic tunnel junction 11). Electrically conductive elements functioning as bit lines (e.g., second conductor 20) extend along the y-direction in a plane on an adjacent side (e.g., bottom side) of the array 612. The bit lines are in contact with the reference layers of the magnetic tunnel junctions. In one example there is one word line for each row of the array 612 and one bit line for each column of the array 612.

Electrically conductive elements functioning as read lines also extend along the one direction (e.g., the y-direction). The read lines may be further from the tunnel junctions than the bit lines, and may be insulated from the bit lines. The MRAM device 610 also includes first and second row decoders 614a and 614b, first and second column decoders 614a and 616b, and a read/write circuit 618. The read/write circuit 618 includes a sense amplifier 620, ground connections 622, a row current source 624, a voltage source 626, and a column current source 628. In one embodiment, the same electrical conductor can function as a read and/or a write line.

During a write operation on a selected magnetic tunnel junction (e.g., magnetic tunnel junction 11), the first row decoder 614a connects one end of a selected word line (e.g., first conductor 18) to the row current source 624, the second row decoder 614b connects an opposite end of the selected word line to ground, the first column decoder 614a connects one end of a selected bit line (e.g., second conductor 20) to ground, and the second column decoder 616b connects the opposite end of the selected bit line to the column current source 628. As a result, write currents flow through the selected word and bit lines (e.g., 18 and 20). The write currents create magnetic fields, which cause the magnetic moments of the data and/or reference layers to be oriented in a particular direction and impact the magnetic tunnel junction. The column decoders 614a and 616b may also cause a write current to flow through the read line (e.g., conductor 22) crossing the selected magnetic tunnel junction. This third "write" current creates an additional magnetic field that assists in switching the orientation of magnetic moments associated with the selected magnetic tunnel junction. The easy axis of the data layers may be oriented in the y-direction and the data layers magnetic vectors oriented in the y-direction accordingly.

During a read operation on a selected magnetic tunnel junction, the first and second column decoders 616a and 616b may cause a steady current to flow through a reference orientation line crossing the selected magnetic tunnel junction (e.g., magnetic tunnel junction 11). The reference orientation current generates a magnetic field that causes the magnetization vector or vectors of a reference layer (e.g., M2A and M2B) to be oriented parallel to the word lines (e.g., first conductor 18). While the reference orientation current is still applied, the first row decoder 614a connects the voltage source 626 to a selected word line (e.g., conductor 18), and the first column decoder 616a connects a selected bit line (e.g., conductor 20) to a virtual ground input of the sense amplifier 620. As a result, a sense current flows through the selected magnetic tunnel junction (e.g., magnetic tunnel junction 11) to the input of the sense amplifier 620. In this fashion, the resistance of the selected magnetic tunnel junction may be determined. However, the present invention is not limited to this method of determining the resistance of the magnetic tunnel junctions.

The present invention is readily adaptable to the optional use of cladding on the conductors. Cladding provides greater shielding of neighboring elements and for example, the reference lines may be combined with the word, bit and/or read lines by cladding reference line ferromagnetic material on any of the other lines. In one exemplary implementation, combing the reference lines with other lines facilitates elimination of an extra interconnect layer and the reduction of power consumption, since the cladding allows read and write current magnitudes to be reduced.

Although the description of the present invention refers to tunnel magnetic resistance devices (TMR), it is not necessarily limited to this type of magnetic memory device. The present invention may be implemented in association with other types of magneto-resistive devices that have similar operation characteristics. For instance, the present invention may be applied to giant magneto-resistive (GMR) devices. A GMR device has the same basic configuration as a TMR device, except that data and reference layers are separated by a conductive non-magnetic layer instead of an tunnel barrier. Exemplary layer metals include, gold, silver and copper. The relative orientations of the data and reference magnetization vectors affect in-plane resistance of a GMR device. Alternatively the present invention may be applied to top and bottom spin values.

Thus, the foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various modifications as are suited to the particular use contemplated. It is intended that the scope of the invention be defined by the Claims appended hereto and their equivalents.

What is claimed is:

1. A magnetic memory device comprising:
   a synthetic ferrimagnetic data layer having a magnetic moment directable to a first orientation and a second orientation;
   a soft reference layer with a lower coercivity than said synthetic ferrimagnetic data layer; and a tunneling layer having electrical resistance qualities which are influenced by magnetic moment orientations of said synthetic ferrimagnetic data layer and said soft reference layer.

2. A magnetic memory device of claim 1, where in said soft reference layer includes ferromagnetic material.

3. A magnetic memory device of claim 1, wherein said soft reference layer is a soft synthetic ferrimagnetic reference layer.

4. A magnetic memory device of claim 3, wherein said synthetic ferrimagnetic data layer and said soft synthetic ferrimagnetic reference layer each include:
   a first sub-layer having a magnetic moment orientation rotatable to either said first or said second orientations;
   a second sub-layer having a magnetic moment orientation that is maintained substantially opposite of said first sub-layer; and
   a spacer sub-layer that magnetically couples said first layer sub-layer and said second sub-layer.

5. A magnetic memory device of claim 4, wherein said soft synthetic ferrimagnetic reference layer has a net coercivity that is substantially zero.

6. A magnetic memory device of claim 4, wherein said data synthetic ferrimagnetic layer has a net coercivity that is substantially greater than said soft synthetic ferrimagnetic reference layer.

7. A magnetic memory device of claim 4, wherein said first sub-layer and said second sub-layer have different configurations in said synthetic ferrimagnetic data layer and said soft synthetic ferrimagnetic reference layer.

8. A magnetic memory device of claim 1, wherein said synthetic ferrimagnetic data layer and said soft reference layer are cladded.

9. A magnetic memory device of claim 1, wherein said first and second magnetic orientations are induced by an applied magnetic field.

10. A magnetic memory device of claim 9, wherein the intensity of said applied magnetic field is on the order of less than a few thousand amperes/meter.

11. A magnetic memory device comprising:
   a synthetic ferrimagnetic sense layer operable for magnetization in either of two discernable states;
   a soft reference layer that changes magnetization orientation easier than said synthetic ferrimagnetic data layer; and
   a resistance layer that resists electrical current, wherein resistance to said electrical current changes depending upon the relative direction of said a first orientation and a second orientation.

12. A magnetic memory device of claim 11, wherein said soft reference layer is a soft synthetic ferrimagnetic reference layer.

13. A magnetic memory device of claim 12, wherein said synthetic ferrimagnetic data layer and said soft synthetic ferrimagnetic reference layer each comprise:
   a first sub-layer controllable to either of two magnetic vector orientations;
   a second sub-layer that maintains a magnetic vector orientation substantially opposite to a magnetic vector orientation of said first sub-layer of magnetic material; and
   a spacer sub-layer that magnetically couples said first sub-layer and said second sub-layer.

14. A magnetic memory device of claim 13, wherein said first sub-layer of magnetic material and said second sub-layer of magnetic material have a combined coercivity that is relatively small compared to the coercivity of said sense layer.

15. A magnetic memory device of claim 14, wherein said first sub-layer of magnetic material and said second sub-layer of magnetic material have a combined coercivity that is relatively large compared to the coercivity of said soft reference layer.

16. A magnetic memory system comprising:
   an array of magnetic storage cells, wherein said storage cells include a synthetic ferrimagnetic data layer and a soft reference layer;
   a plurality of first electrically conductive elements extending along said array in a first direction, said plurality of first electrically conductive elements magnetically coupled to said storage cells; and
   a plurality of second electrically conductive elements extending along said array in a second direction, said plurality of second electrically conductive elements magnetically coupled to said storage cells.

17. The magnetic memory system of claim 16, further comprising a plurality of third electrically conductive elements extending in said second direction, said second and third electrically conductive elements being separated by an electrical insulator.

18. The magnetic memory system of claim 16, further comprising a circuit for applying a current to selected elements of said plurality of first electrical conductive elements and said plurality of second electrical conductive elements.

19. The magnetic memory system of claim 16, further comprising a circuit for applying a voltage between a selected element of said first electrically conductive elements and a selected element of said second electrically conductive elements.

20. The magnetic memory system of claim 16, further comprising a circuit for measuring current through said selected elements of said first and second electrically conductive elements to measure resistance to said current.

21. A magnetic memory device comprising:
   a means for establishing a first magnetic moment orientation in a synthetic ferrimagnetic data layer, wherein said first magnetic orientation is the sum effect of multiple magnetic moments in sub-layers;
   a means for establishing a second magnetic moment orientation that is softer than said first magnetic moment orientation; and
   a means for resisting a current flow, wherein resistance to said current flow is altered according to the direction of said magnetic moment orientations.

22. The magnetic memory device of claim 21 wherein said first magnetic moment orientation is associated with the logical value of an information bit.

23. The magnetic memory device of claim 21 wherein said second magnetic moment orientation is a predetermined reference direction.

24. The magnetic memory device of claim 21 wherein said means for resisting a current flow includes a means for establishing a magneto-resistive tunnel.

* * * * *